(12) United States Patent
Keller et al.

(10) Patent No.: US 6,502,223 B1
(45) Date of Patent: Dec. 31, 2002

(54) METHOD FOR SIMULATING NOISE ON THE INPUT OF A STATIC GATE AND DETERMINING NOISE ON THE OUTPUT

(75) Inventors: S Brandon Keller, Fort Collins, CO (US); Gregory D. Rogers, Fort Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 72 days.

(21) Appl. No.: 09/845,437

(22) Filed: Apr. 30, 2001

(51) Int. Cl.[7] .............................................. G06F 17/50
(52) U.S. Cl. .............................. 716/5; 716/716; 716/4; 716/16; 716/18
(58) Field of Search ............................ 716/2, 3, 5, 16, 716/18, 4, 6

(56) References Cited

U.S. PATENT DOCUMENTS 6,253,351 B1 * 6/2001 Fukui et al. .................. 716/2
6,405,347 B1 * 6/2002 McBride ....................... 716/4
6,408,425 B1 * 6/2002 Mizutani ....................... 716/5

* cited by examiner

Primary Examiner—Tom Thomas
Assistant Examiner—Douglas W. Owens
(74) Attorney, Agent, or Firm—John R. Pessetto

(57) ABSTRACT

A method for simulating noise on the input of a static logic gate and determining noise on the output of the static logic gate. The method identifies the PFETs and NFETs that are used when a particular voltage pattern drives the input of a static gate. After the FETS have been identified, P/N ratios are calculated for all possible input combinations. A maximum or minimum P/N ratio may be chosen and a noise signal simulated on the input of the gate. The signal created on the output of this gate is noise that may be used to evaluate other circuits for noise problems. Using noise created by this method, integrated circuit designers can create computer simulations that better model the electrical environment that integrated circuits operate in.

18 Claims, 14 Drawing Sheets

METHOD FOR SIMULATING NOISE ON THE INPUT OF A STATIC GATE AND DETERMINING NOISE ON THE OUTPUT

CROSS-REFERENCED RELATED APPLICATIONS

This application is related to an application Ser. No. 09/845,384, titled "A method for calculating the P/N ratio of a static gate based on input voltages", filed on or about the same day as the present application.

FIELD OF THE INVENTION

This invention relates generally to electronic circuits. More particularly, this invention relates to integrated electronic circuits designed with CMOS Field Effect Transistors (FETs).

BACKGROUND OF THE INVENTION

Integrated circuits are electrical circuits comprised of transistors, resistors, capacitors, and other components on a single semiconductor "chip". The components on a chip are interconnected to perform a given function or number of functions, such as a microprocessor, a programmable logic device (PLD), a electrically erasable programmable memory (EEPROM), a random access memory (RAM), an operational amplifier, or a voltage regulator. A circuit designer typically designs the integrated circuit by creating a circuit schematic indicating the electrical components and their interconnections. Designs can be simulated by computer to verify functionality and to ensure performance goals are satisfied.

In the world of electrical device engineering, the design and analysis work involved in producing electronic devices is often performed using electronic computer aided design (E-CAD) tools. Electronic devices include electrical analog, digital, mixed hardware, optical, electromechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. A "netlist" is a detailed circuit specification used by logic synthesizers, circuit simulators and other circuit design tools. A netlist typically comprises information on circuit components and the interconnections between those components.

Two forms of a netlist are the flat netlist and the hierarchical netlist. Often a netlist will contain a number of circuit "modules" which are used repetitively throughout the larger circuit. A flat netlist contains multiple copies of circuit modules essentially containing no boundary differentiation between circuit modules and other components in the device. By way of analogy, one graphical representation of a flat netlist is simply the complete schematic of the circuit device represented with primatives only.

In contrast, a hierarchical netlist will only maintain one copy of a circuit module that may be used in multiple locations. By way of analogy, one graphical representation of a hierarchical netlist would show the basic and/or non-repetitive devices in a schematic form and the more complex and/or repetitive circuit modules would be represented by "black boxes." A black box is a system or component whose inputs, outputs, and general function are known, but whose contents are not shown. These "black box" representations may mask the complexities of the circuit allowing a level of abstraction that may show only inputs and outputs or some other small set of information.

The design of an integrated circuit can be represented at different levels of abstraction, such as the Register-Transfer level (RTL) and the logic level, using a hardware description language (HDL). VHDL and Verilog are examples of HDL languages. At any abstraction level, an integrated circuit design may be specified using behavioral or structural descriptions or a mix of both. At the logical level, the behavioral description is specified using boolean equations. The structural description is represented as a netlist of primative cells. Examples of primitive cells are full-adders, NAND gates, latches, and D-Flip Flops.

Systems may use the information provided in netlists to evaluate circuit timing and other related parameters. More specifically, systems may perform a timing analysis of circuits using netlist files. Although the operational specifics may vary from system to system, generally such systems may operate by identifying certain critical timing paths, then evaluating the circuit to determine whether timing violations may occur through the critical paths. Timing specifications may be provided to such systems by way of a configuration file.

One such system is marketed under the name PathMill©, by EPIC Design Technology, Inc. (purchased by Synopsys). PathMill© is a transistor-based analysis tool used to find critical paths and verify timing in semiconductor designs. Using static and mixed-level timing analysis, PathMill© processes transistors, gates, and timing models. It also calculates timing delays, performs path searches, and checks timing requirements. PathMill© can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill© product and other similar products. For example, there is a often a need to identify gates such as NAND gates and NOR gates from a transistor level circuit design, in order to verify that certain design criteria have not been violated. For example, it is sometimes desirable to insure that the PFET (P-channel Field Effect Transistor) to NFET (N-channel Field Effect Transistor) transistor width ratio, $(W_p/L_p)/(W_n/L_n)$, is within a certain predefined range for certain gates (e.g., NOR and NAND gates). The PFET-to-NFET transistor width ratio is also dependent on the input voltages supplied to the gates. Accordingly, there is a need to provide a design tool that evaluates a netlist or other electronic file representative of an electronic circuit to identify the PFET-to-NFET transistor width ratios of static gates based on the inputs to these gates.

SUMMARY OF THE INVENTION

In a preferred embodiment, the invention provides a method for simulating noise on the input of a static gate and determining noise on the output. The invention determines a P/N ratio for all input combinations for a given static logic gate. A particular P/N ratio may be used in a simulation to determine a worst case noise on the output of a static logic gate. The resulting output noise signal is used with other simulations to determine if noise problems exist with a design containing the particular static logic gate. This method enables circuit-designers to better design VLSI chips and as a result decrease the chances that hardware will have design flaws.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENT

Figure 1:
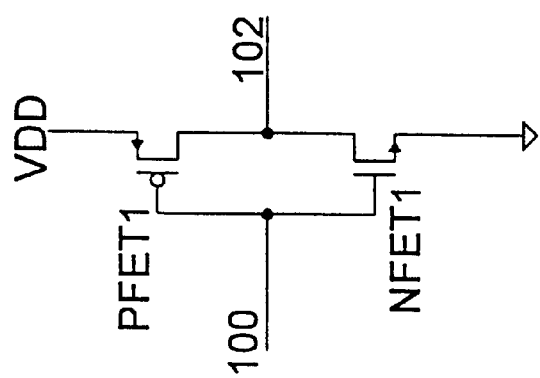
FIG. 1 is a schematic drawing of an inverting logic gate.

For the purposes of this discussion, the trip-point of a static logic gate may be defined as the voltage applied to the input of a static logic gate such that the output of the static gate is equal to the input. This value can be determined by using SPICE or some other circuit simulator, or some other known analytical methods. FIG. 1 is a schematic drawing of an inverter. Using SPICE or some other circuit simulator, the trip-point of the inverter in FIG. 1 can be determined by connecting the output, 102, to the input, 100 and allowing the voltage on node 102 and node 100 to reach a steady-state value. In the case of the inverter in FIG. 1, the output, 102, will begin to fall to a lower voltage than the trip-point voltage as the input, 100, is raised above the voltage of the trip-point voltage. If the input voltage, 100, is lowered below the trip-point, the output voltage, 102, will begin to raise above the trip-point voltage. The trip-point is determined primarily by the ratio of the PFET, PFET1, to the NFET, NFET1. Other parameters such as temperature and process variations can change the trip-point but these parameters are usually accounted for in a SPICE simulation. In FIG. 1, the trip-point can be raised, closer to the supply rail, VDD, by either increasing the width of PFET1 or decreasing the width of NFET1 or doing both. Conversely, the trip-point of the inverter in FIG. 1 can be lowered by either increasing the width of NFET1 or decreasing the width of PFET1 or doing both. Often, the lengths of PFET1 and NFET1 are the same value and can not be adjusted. The particular P/N ratio chosen for a particular circuit may be dependent on what switching speed is needed for a particular transition edge. For example, if a designer wanted the positive-going edge (low to high voltage) on the input of an inverter to switch more quickly than the negative-going edge (high to low voltage), the width of the NFET could be increased or the width of the PFET could be decreased or both. The length of the PFET and the NFET are usually the same so the P/N ratio is usually the width of the PFET divided by the width of the NFET. In the case where the lengths of the PFET and NFET are different, the P/N ratio is $(W_p/L_p)/(W_n/L_n)$. The absolute widths of the PFET and NFET are dependent on other factors such as the load the inverter is driving. In a noiseless environment, on a chip using CMOS static gates, the input to a gate would ideally be either supply rail, VDD or GND. However, this does not always occur in actual practice. Noise may occur in a circuit, and it may cause noise that may propagate through circuits and cause timing or data errors, or other problems.

Noise may be caused by many sources. For example, noise may occur when the input momentarily raises above the trip-point of a gate while being held low or falls below the trip-point of the static gate while the input is being held high. In FIG. 1, if the input, 100, is held low and the input raises above the trip-point of the inverter, the output, 102 will momentarily, fall to a voltage lower than VDD. Noise on inputs may be caused by "ground-bounce", capacitive coupling between other lines, along with other causes. In order to more accurately detect data errors, timing errors or other problems caused by glitches, it is important to more accurately calculate P/N ratios on static gates. The method described following allows more accurate P/N ratios to be calculated.

Figure 2:
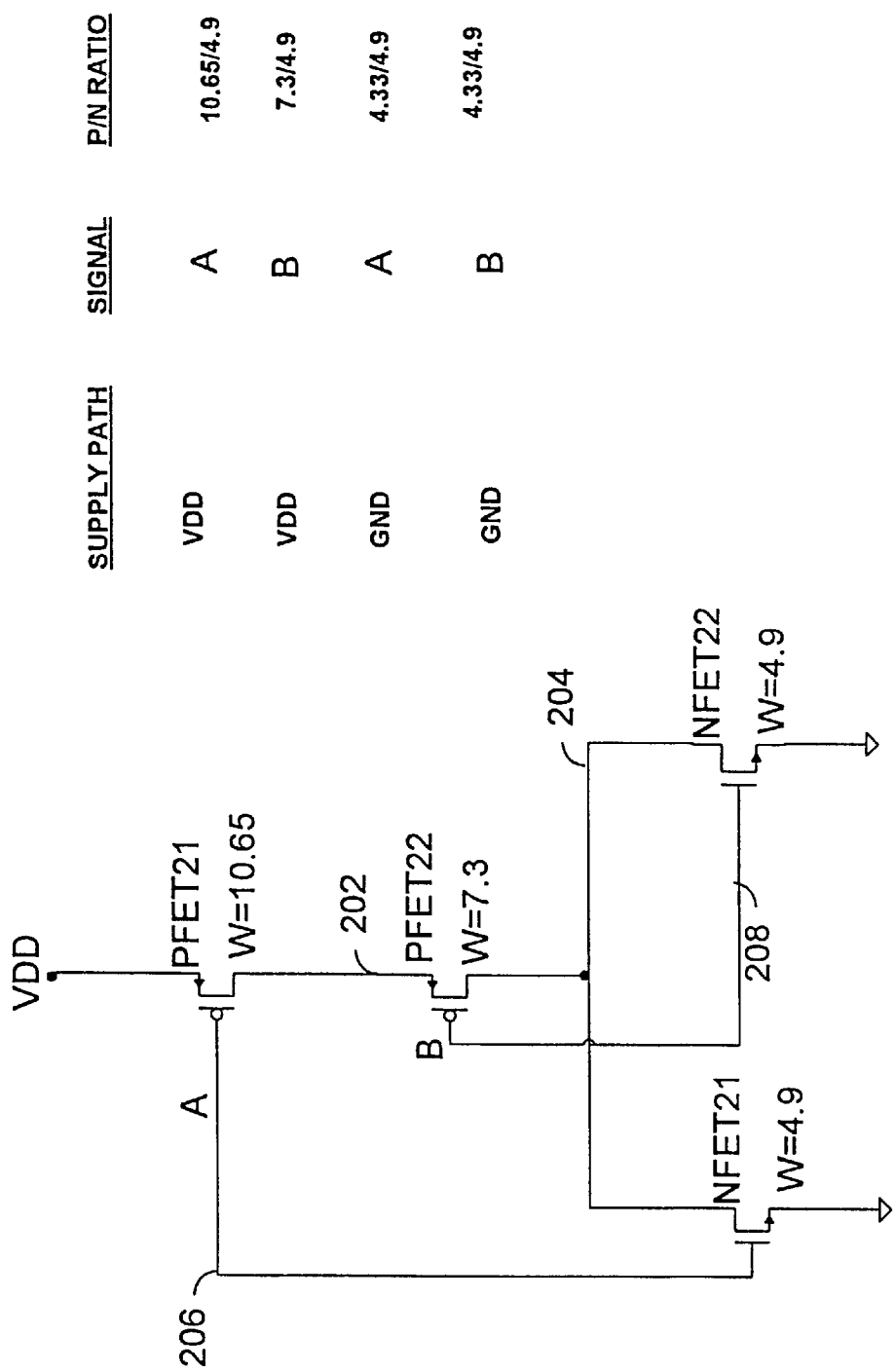
FIG. 2 is a schematic drawing of a NOR static logic gate.

To illustrate the method used to determine a P/N ratio, FIG. 2 will be used as an example. First, the static NOR gate shown in FIG. 2 is extracted using an automated method. One method to extract static logic is disclosed in U.S. Pat. No. 6,077,717. This document is hereby incorporated herein by reference. The first calculation done is the maximum P/N ratio. In this case, the output normally is being held "low" and any noise added will try to raise the output voltage and possibly cause a glitch. The maximum P/N ratio makes it "easier" for noise to raise the low voltage of the output, node 204 to a higher voltage. Next, a "branch" in the NOR gate is identified. A "branch" is defined as a unique path from the static gate output, through a FET (Field Effect Transistor) or a series of FETs to either supply rail, VDD or GND. In the particular case shown in FIG. 2, a branch from node 204 to VDD is identified. The method asks if this branch is always on, and if it is on, it aborts the program because this indicates the output of the gate is permanently connected to the supply rail VDD and not controlled by an input signal. There are two PFETs (P-type Field Effect Transistor) in series in this branch. Each PFET, PFET21 and PFET22, has a different signal driving their gates. PFET21 has signal A driving node

206 and PFET22 has signal B driving node 208. Since the P/N ratio is calculated based on the signal pattern on each gate, the method may choose signal A, node 206 first. For this case, the method assumes that node 206 is high, ("off" for a PFET) and that node 208 is low, ("on" for a PFET). Since the width of PFET21 is 10.65 the program stores this value for the widest PFET for signal A and stores the name of signal B and the fact that signal B, 208 is on. Since PFET21 is the only FET driven by signal A in this branch, the program asks if there is another branch connected from the output, node 204 to VDD and has a FET controlled by signal A. There is only one branch from the output, node 204 to VDD in FIG. 2, so the program next calculates the smallest width of a NFET that is controlled by signal A, node 206 and is contained in a branch from the output, node 204 to GND. There is only one branch with the signal A, node 206, that controls the gate of an NFET. The width of this NFET, NFET21 is 4.9, so the minimum width is 4.9. The maximum P/N ratio is now calculated for signal A, node 206. The P width is 10.65 and the N width is 4.9 so the P/N ratio is 10.65/4.9. This is a worst case value because the width of PFET22 was not included in series with the width of PFET22. If it had been included, the maximum value of the P width would have been smaller and the effect of noise would not have been as pronounced in this case. Calculating the maximum P width in this way gives a more pessimistic value, which may provide some margin for error when modeling noise or other related problems. The maximum P/N ratio for signal B, node 208, is calculated in a similar way with the result of a P/N ratio of 7.5/4.9. The method used to determine the maximum P/N ratio for a given signal is also illustrated in Table 1.

TABLE 1

```
for each (p-fet branch)
{
    if (contains SUT FET)
    {
        Store biggest SUT FET width in the branch (this is
pessimistic, the optimistic case would be to parallelize all SUT FET
widths in branch) and all signal names which were set low to turn on
the branch (except SUT).
    }
    else if (branch always on)
    {
        abort noise analysis
    }
}
for each (n-fet branch)
{
    if (contains SUT FET)
    {
        Store effective branch width (parallelize all FETs
widths in branch) and all signal names which were set high to turn on
the branch (except SUT).
    }
    else if (branch always on)
    {
        abort noise analysis
    }
}
for each (n-fet compressed branch #1)
{
    for each (n-fet compressed branch #2)
    {
        if (cb# 2 != cb#1)
        {
            if (n-fet cb#2 is always on because of logic
values in n-fet cb#1 or global defines)
```

TABLE 1-continued

```
            {
                add cb#2 eff. width to cb#1 eff. width.
                remove cb#2.
            }
        }
    }
}
for each (n-fet super compressed branch)
{
    total p-fet eff. width = 0
    for each (p-fet compressed branch)
    {
        if (p-fet branch can be turned on)
        {
            total p-fet eff. width += branch eff. width
        }
    }
    if (highest p:n ratio seen so far)
    {
        max. gate p:n ratio = total p-fet eff. width/n-fet spb
width
    }
}
```

The same method used to calculate the maximum P/N ratio is used to calculate the minimum P/N except the maximum NFET value is calculated in the same way the maximum PFET was determined and the minimum PFET value is calculated in the same way the minimum NFET was determined. One case where the minimum P/N ratio may be used is when the output is being held high and noise on the NFETs of the static circuit may try to drag the voltage on the output lower. Again, using the NOR static gate in FIG. 2, the program looks for a branch from the output, node 204 to GND. In this case, there are two branches connected to GND. One branch contains NFET21 which is controlled by signal A, node 206, and the other branch contains NFET22 controlled by signal B, node 208. The maximum width for both of these branches is 4.9. Next, the branches from the output, node 204, to VDD are determined. In this case, there is only one branch. The minimum P width for both signal A and signal B is by calculated by "parallelizing" the widths of PFET21 and PFET22. The width of PFET21 is 10.65 and the width of PFET22 is 7.3. When these two widths are parallelized, the result is a width of 4.33. The method used for parallelizing FET widths in series is show in equation 1.

$$W_p = 1/\{1/W_1 + 1/W_2 + 1/W_3 + \ldots\} \qquad \text{EQ. 1}$$

Using the P value calculated above, 4.33 and the N value previously derived, the minimum P/N ratio for both signal A, node 206 and signal B, node 208 is 4.33/4.9. The benefit of calculating both a maximum and minimum P/N ratio can be seen in this example. When the output of the NOR gate in FIG. 2 is being held low, the maximum P/N ratio, 10.65/4.9 would more likely drag the output, node 204 higher than a P/N ratio of 4.33/4.9 would given a glitch on signal A, node 206. The minimum P/N ratio, 4.33/4.9, would more likely create a glitch when the output, node 204, is held high, and signal A, node 206 glitches high, than the maximum P/N ratio, 10.65/4.9. The input values to signals A and B, nodes 206 and 208 respectively, that are necessary to make possible the maximum and minimum P/N ratios, are stored along with the calculated P/N ratios. The algorithm for calculating the maximum P/N ratio for a given signal is shown in FIGS. 6A, 6B, and 6C. The algorithm for calculating the minimum P/N ratio for a given signal is shown in FIGS. 5A, 5B, and 5C.

Figure 5A:
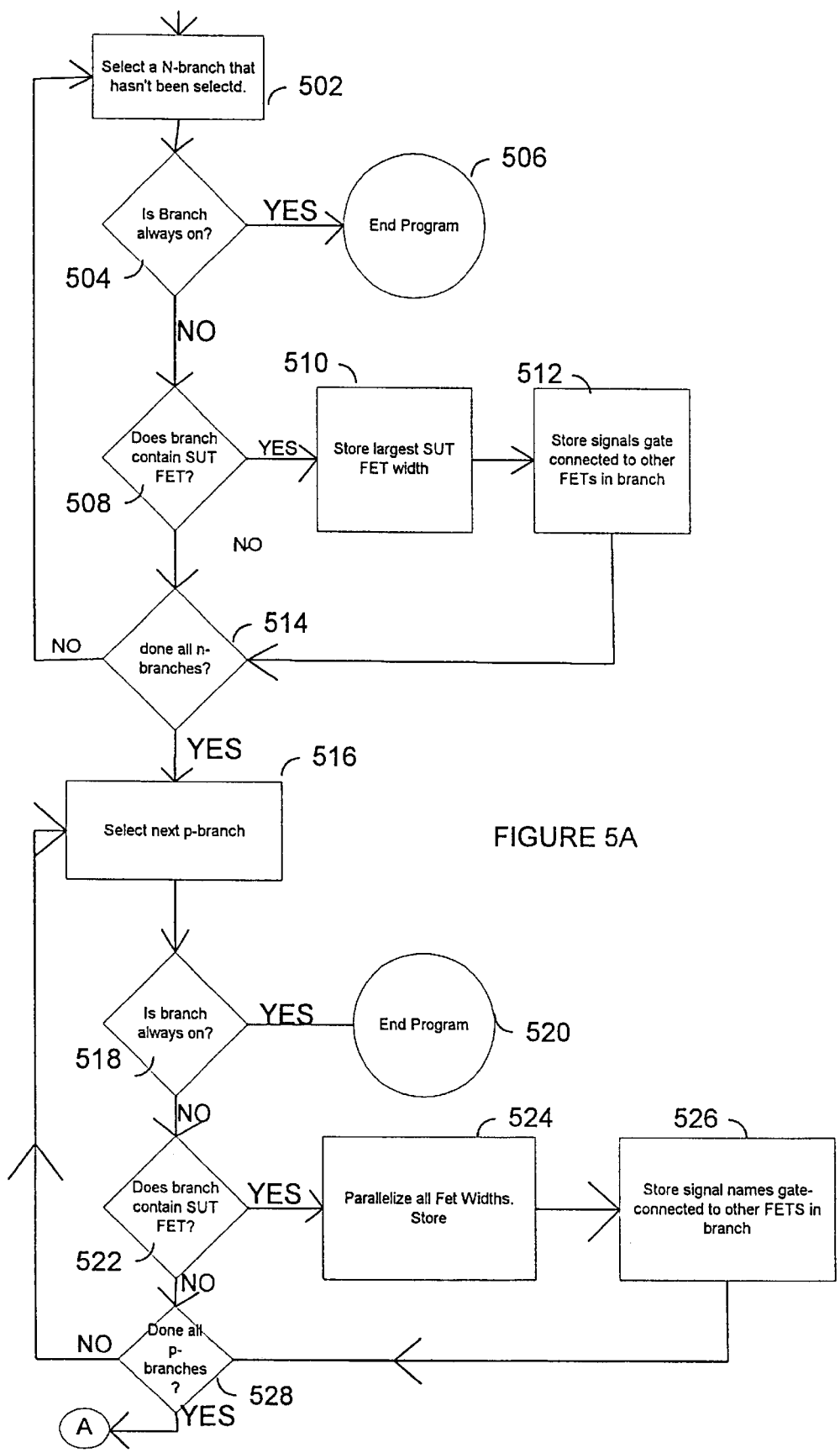
FIG. 5a is part of a flow diagram of the method used to calculate the minimum P/N value for a static logic circuit.
Figure 5B:
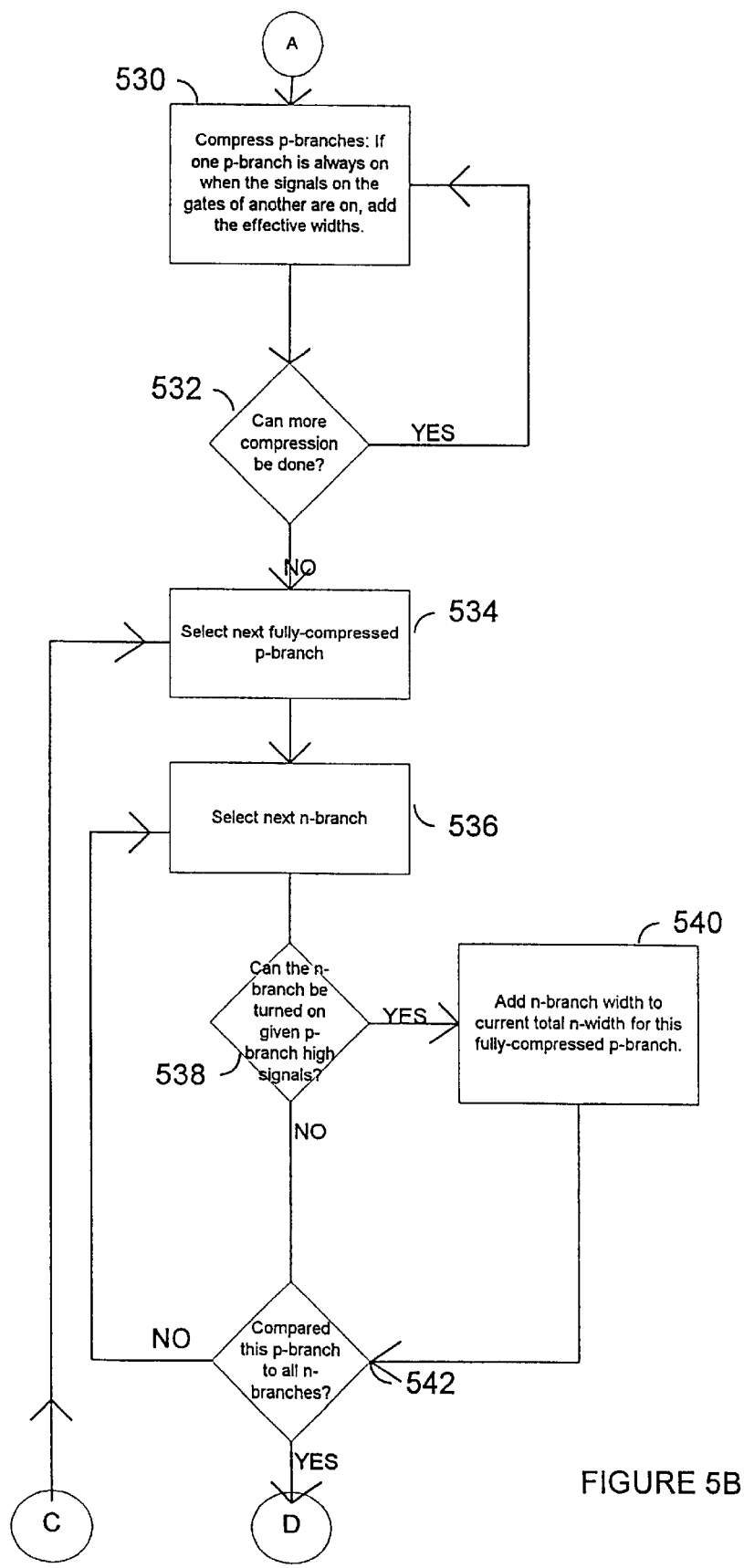
FIG. 5b is part of a flow diagram of the method used to calculate the minimum P/N value for a static logic circuit.
Figure 5C:
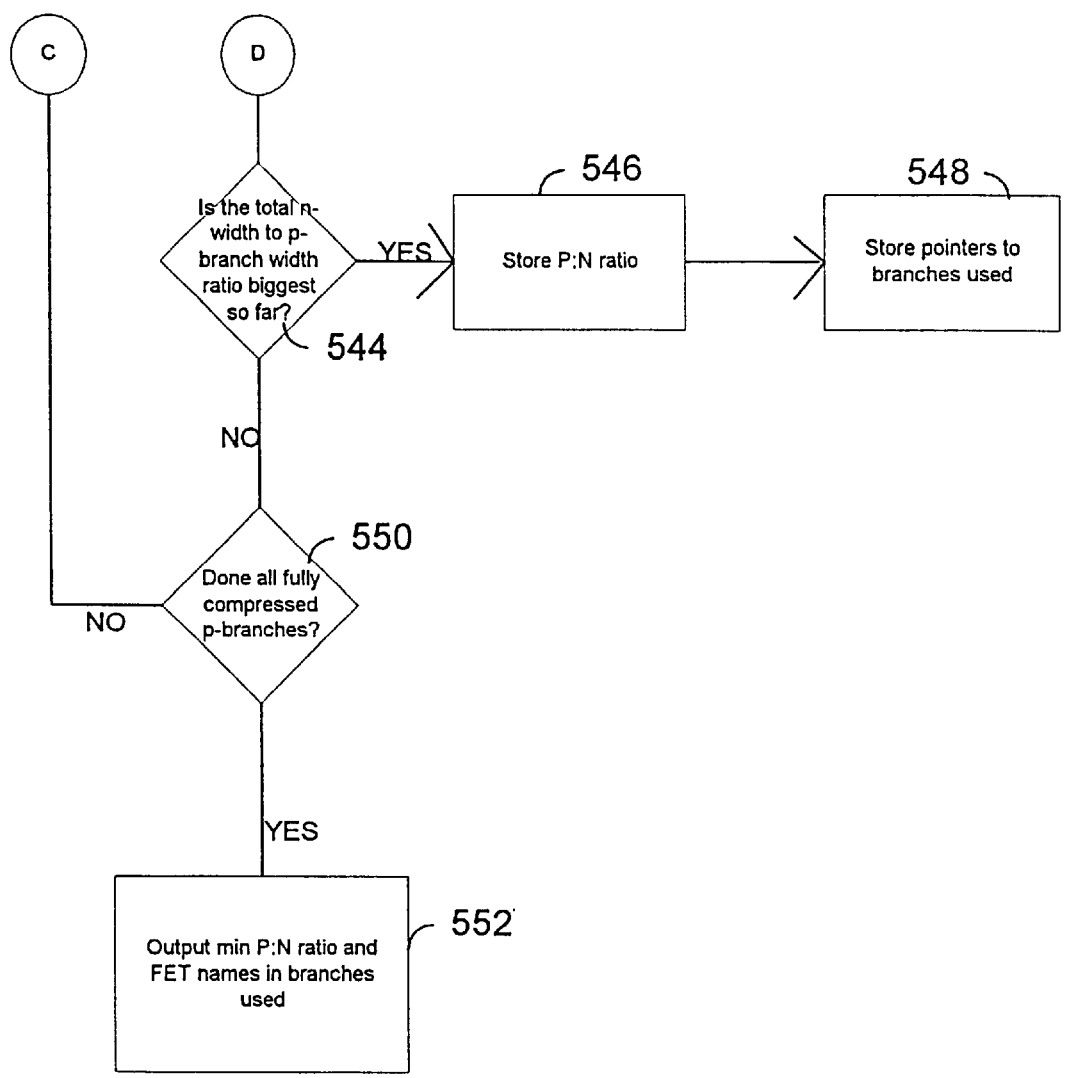
FIG. 5c is part of a flow diagram of the method used to calculate the minimum P/N value for a static logic circuit.
Figure 6A:
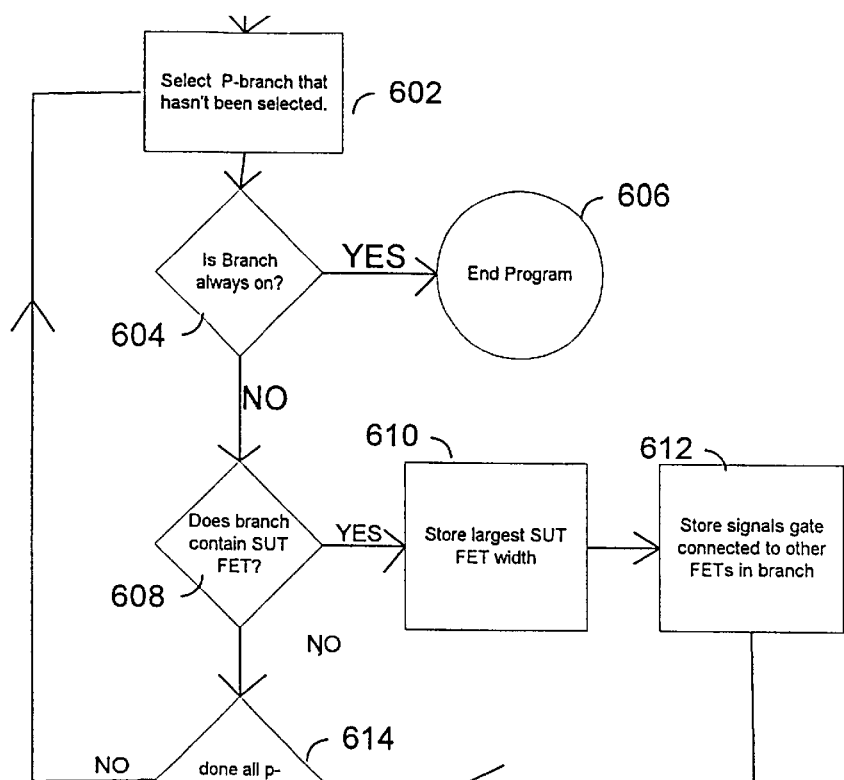
FIG. 6a is part of a flow diagram of the method used to calculate the maximum P/N value for a static logic circuit.
Figure 6A:
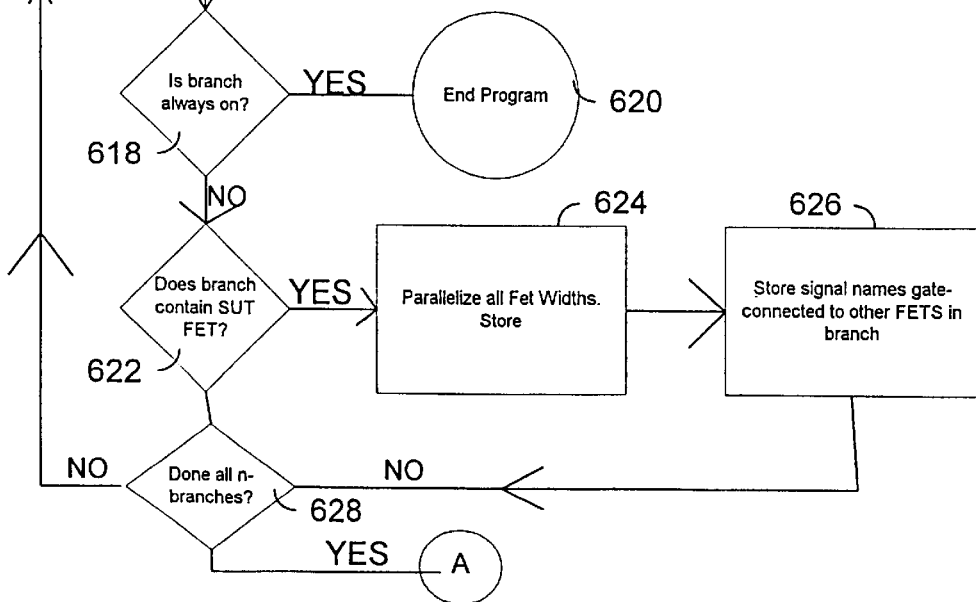
Figure 6B:
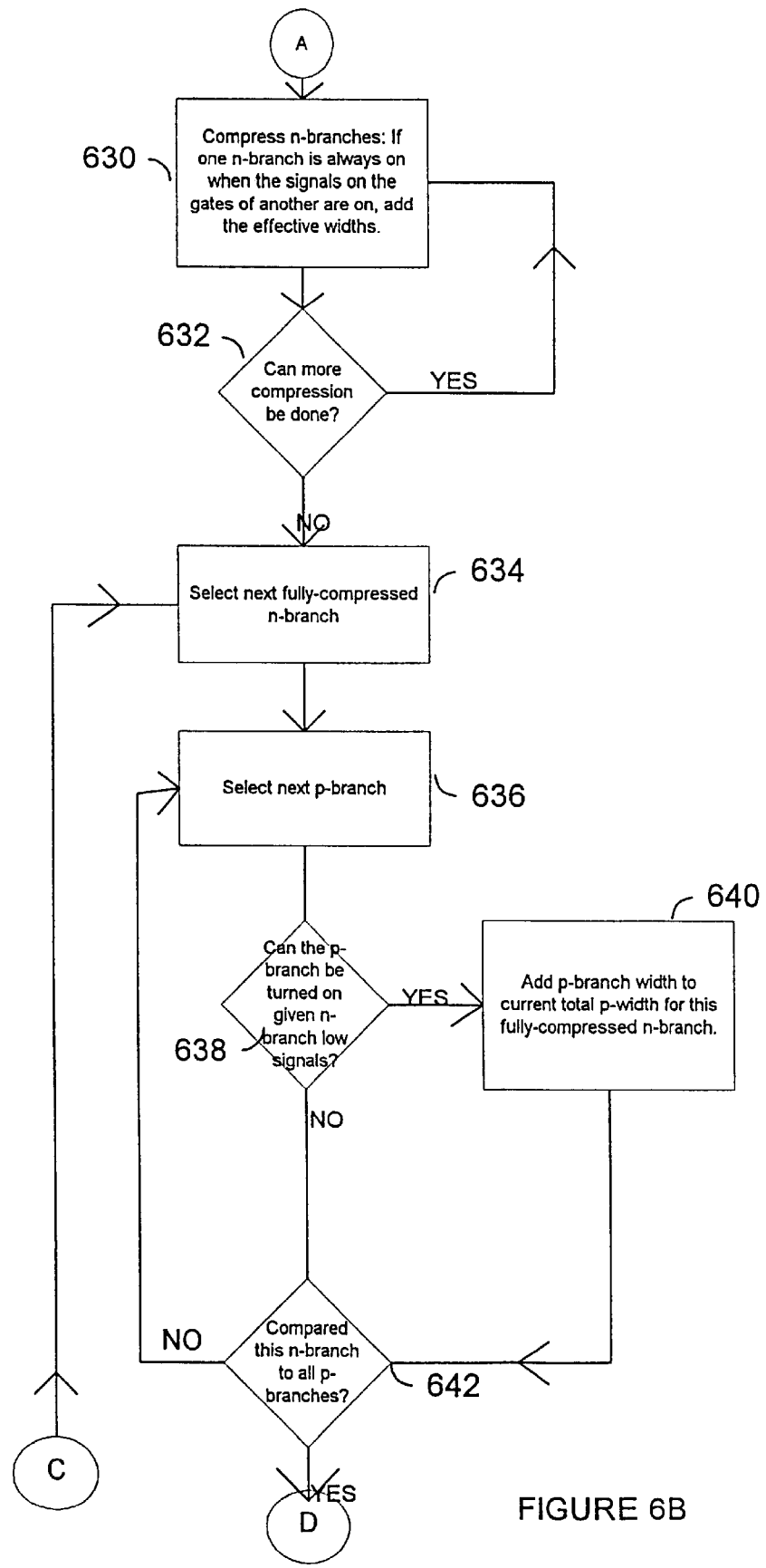
FIG. 6b is part of a flow diagram of the method used to calculate the maximum P/N value for a static logic circuit.
Figure 6C:
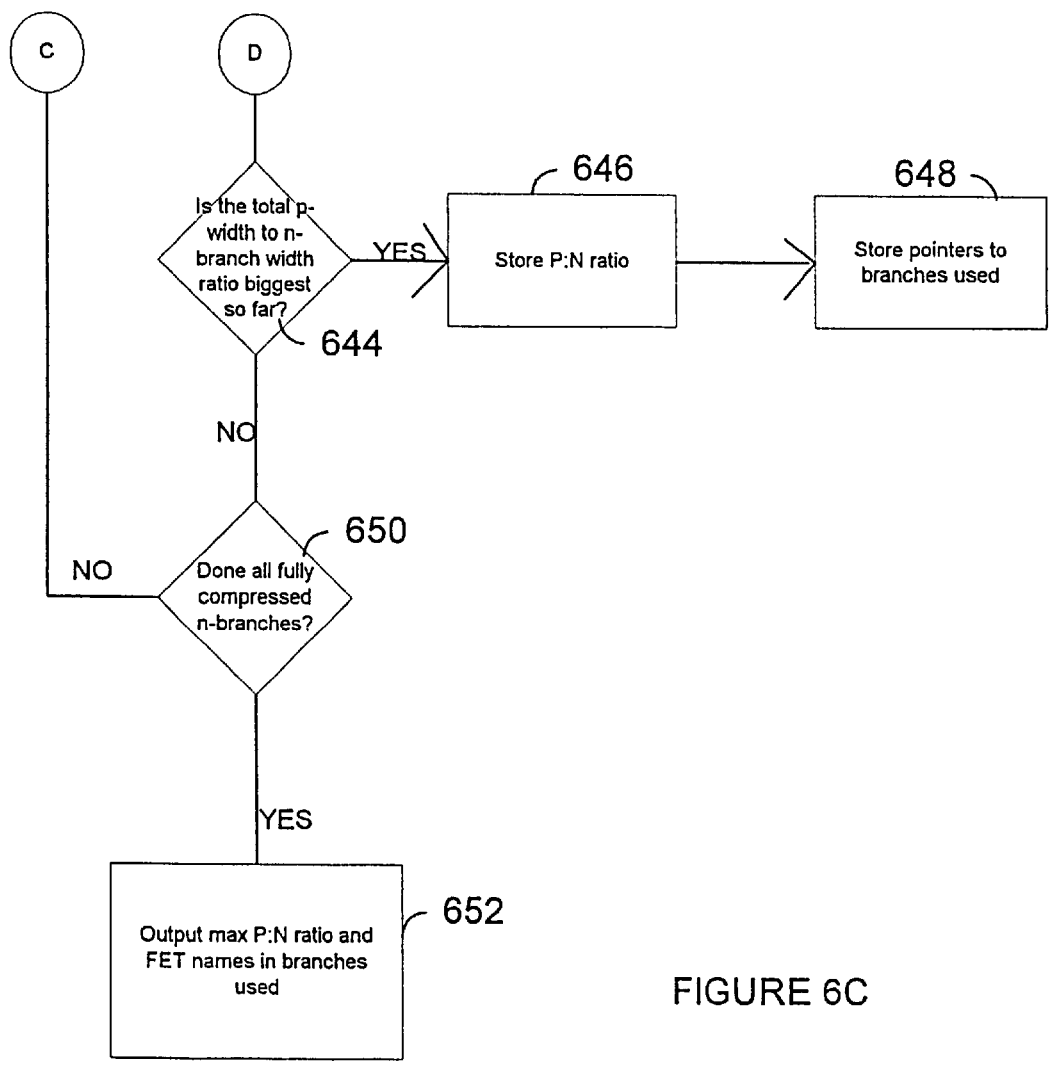
FIG. 6c is part of a flow diagram of the method used to calculate the maximum P/N value for a static logic circuit.

In FIG. 5A, a step 502, selects a N-branch and proceeds to a step 504. In a step 504, the process determines if the selected N-branch is always on. If yes, a step 506 ends the program. If no, the process proceeds to a step 508. In a step 508, the process determines if a branch contains the SUT FET. If yes, a step 510 stores the largest SUT FET width and proceeds to a step 512. In a step 512, the process stores signals gate-connected to other FETs in the branch, and proceeds to a step 514. If no, the process proceeds to a step 514. In a step 514, the process determines if all the N-branches are done. If yes, a step 516 selects a P-branch and proceeds to a step 518. If no, the process returns to a step 502. In a step 518, the process determines if the selected P-branch is always on. If yes, a step 520 ends the program. If no, the process proceeds to a step 522. In a step 522, the process determines if the selected branch contains a SUT FET. If yes, a step 524 parallelizes all FET widths and stores them and proceeds to a step 526. In a step 526, the process stores signal names gate-connected to other FETs in the branch and proceeds to a step 528. If no, the process proceeds to a step 528. In a step 528, the process determines if all the P-branches have been done. If yes, the process proceeds to step 530 show in FIG. 5B. If no, the process returns to step 516.

In a step 530, the process compresses the P-branches and if one P-branch is always on when the signals on the gates of another are on, the process adds the effective widths and proceeds to a step 532. In a step 532, the process determines if more compression can be done. If yes, the process returns to step 530. If no, the process proceeds to a step 534. In a step 534, the process selects the next fully-compressed P-branch and proceeds to a step 536. In a step 536, the next n-branch is selected and the process proceeds to a step 538. In a step 538, the process determines if the selected n-branch can be turned on given that the P-branch signal are high. If yes, the process proceeds to a step 540. In a step 540, the process adds the n-branch width to the current total n-width for the fully-compressed P-branch and the process proceeds to a step 542. If no, the process proceeds to a step 542. In a step 542, the process determines if the P-branch has been compared to all N-branches. If yes, the process proceeds to a step 544 shown on FIG. 5C. If no, the process returns to step 536.

In a step 544, the process determines if the total N-width to P-branch width is the largest so far. If yes, the process proceeds to a step 546. In a step 546, the process stores the P/N ratio and proceeds to a step 548. In a step 548, the process stores pointers to the branches used. If no, the process proceeds to a step 550. In a step 550, the process determines if all fully compressed P-branches are done. If yes, the process proceeds to a step 552. In a step 552, the process outputs a minimum P/N ratio and the FET names used in the branches If no, the process returns to step 534.

In FIG. 6A, a step 602, selects a P-branch and proceeds to a step 604. In a step 604, the process determines if the selected P-branch is always on. If yes, a step 606 ends the program. If no, the process proceeds to a step 608. In a step 608, the process determines if a branch contains the SUT FET. If yes, a step 610 stores the largest SUT FET width and proceeds to a step 612. In a step 612, the process stores signals gate-connected to other FETs in the branch, and proceeds to a step 614. If no, the process proceeds to a step 614. In a step 614, the process determines if all the P-branches are done. If yes, a step 616 selects a N-branch and proceeds to a step 618. If no, the process returns to a step 602. In a step 618, the process determines if the selected N-branch is always on. If yes, a step 620 aborts the program. If no, the process proceeds to a step 622. In a step 622, the process determines if the selected branch contains a SUT FET. If yes, a step 624 parallelizes all FET widths and stores them and proceeds to a step 626. In a step 626, the process stores signal names gate-connected to other FETs in the branch and proceeds to a step 628. If no, the process proceeds to a step 628. In a step 628, the process determines if all the N-branches have been done. If yes, the process proceeds to step 630 show in FIG. 5B. If no, the process returns to step 616.

In a step 630, the process compresses the N-branches and if one N-branch is always on when the signals on the gates of another are on, the process adds the effective widths and proceeds to a step 632. In a step 632, the process determines if more compression can be done. If yes, the process returns to step 630. If no, the process proceeds to a step 634. In a step 634, the process selects the next fully-compressed N-branch and proceeds to a step 636. In a step 636, the next P-branch is selected and the process proceeds to a step 638. In a step 638, the process determines if the selected P-branch can be turned on given that the N-branch signal are low. If yes, the process proceeds to a step 640. In a step 640, the process adds the p-branch width to the current total p-width for the fully-compressed N-branch and the process proceeds to a step 642. If no, the process proceeds to a step 642. In a step 642, the process determines if the N-branch has been compared to all P-branches. If yes, the process proceeds to a step 644 shown on FIG. 6C. If no, the process returns to step 636.

In a step 644, the process determines if the total P-width to N-branch width is the largest so far. If yes, the process proceeds to a step 646. In a step 646, the process stores the P/N ratio and proceeds to a step 648. In a step 648, the process stores pointers to the branches used. If no, the process proceeds to a step 650. In a step 650, the process determines if all fully compressed N-branches are done. If yes, the process proceeds to a step 652. In a step 652, the process outputs a maximum P/N ratio and the FET names used in the branches. If no, the process returns to step 634.

Figure 3:
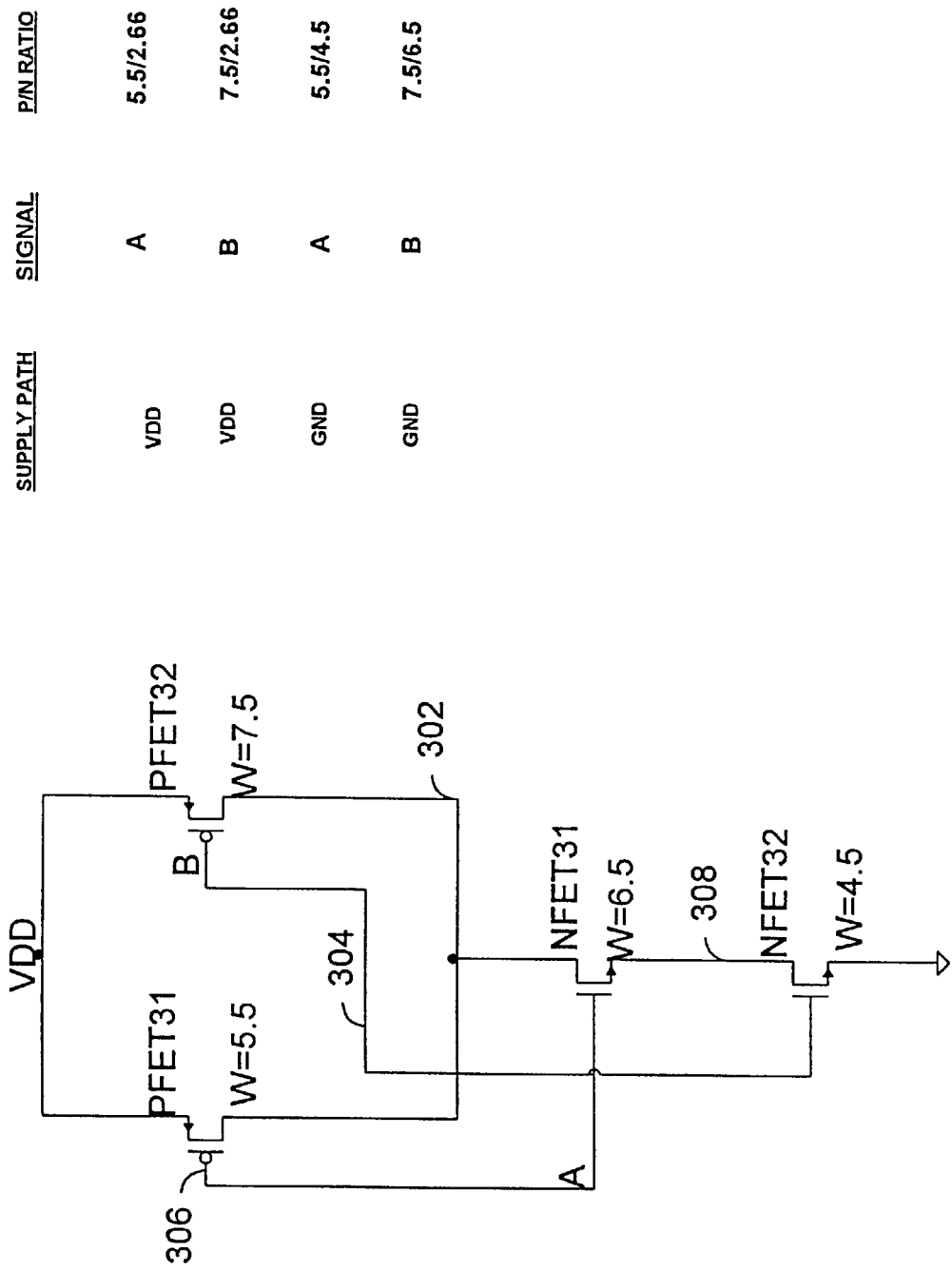
FIG. 3 is a schematic drawing of a NAND static logic gate.

FIG. 3 contains a schematic of a two-input static NAND gate. In this example the maximum P/N ratio for signal A is determined by using the only PFET, PFET31, width contented to signal A, node 306, 5.5 and the parallelized value of NFET31 and NFET32 in series, 2.66. This calculation results in a maximum P/N ratio for signal A, node 306 of 5.5/2.66. The maximum P/N ratio for signal B, node 304 is calculated in a similar way. PFET32 has a width of 7.5 and the parallelized value of NFET31 and NFET32 in series is again 2.66 resulting in a value of 7.5/2.66. These calculations illustrate the importance of determining the maximum P/N ratio for each signal. Signal B, node 304 has a larger maximum P/N ratio than signal A, node 306 and would most likely be more sensitive to noise driving the output, node 302, higher than its nominally held low value.

The minimum P/N ratio for signal A, node 306, in the static NAND gate shown in FIG. 3 is 5.5/6.5. In this case, the P value is the width, 5.5, of PFET31 and the N value is the width, 6.5, of NFET31. The parallelized value of NFET31 and NFET32 is not used because this would result in a smaller N value, 2.66. The method uses the width of NFET31 instead of the parallelized value of NFET31 and NFET32 because this creates a worse case and therefore gives more margin for error. The minimum P/N ratio for signal B is calculated in a similar way. The P value is the width of PFET32, 7.5, and the N value is the width of NFET32, 4.5 resulting in a minimum P/N ratio for signal B, node 305, of 7.5/4.5. Again, this illustrates the importance of determining the minimum value P/N ratio of each signal. Signal A, node 306, has the smaller ratio and would most likely be more sensitive to noise pulling the output, node 302 lower.

Figure 4:
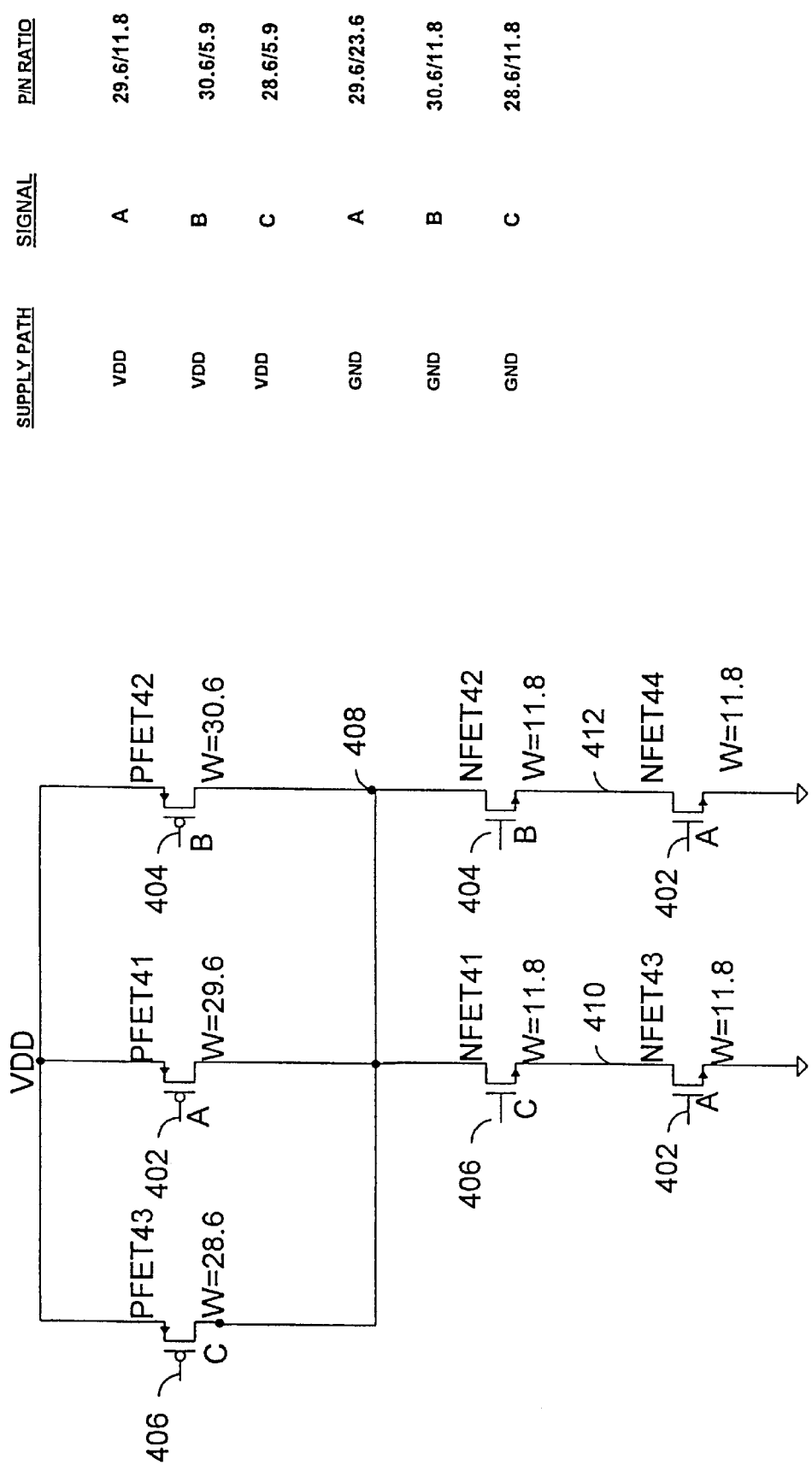
FIG. 4 is a schematic drawing of a complex static logic gate.

FIG. 4 contains a schematic of a complex static logic gate. In this example, there are three branches to VDD and two branches to GND. The P value for both the maximum and minimum P/N ratio is the PFET width associated with each signal because there is only one signal in each branch. Signal A, node 402 has a P value of 29.6, the width of PFET 41. Signal B, node 404, has a P value of 30.6, the width of PFET42, while signal C, node 406, has a P value of 28.6, the width of PFET43. The N value for the maximum P/N ratio for signal A is 11.8 because both branches leading to ground contain signal A, node 402. In order for both branches to conduct to ground signals B and C must be high. The effective width for each branch is the parallelized value of the two NFETs in series, 5.9. Since both branches are conducting, the effective width of both branches is the sum of both effective widths of each branch, 11.8. The resultant maximum P/N ratio for signal A is 29.6/11.8. The N value for the maximum P/N ratio for signal B, node 404, is the parallelized value of the branch that contains NFET42 and NFET44, 5.9. In a similar manner, the N value for the maximum P/N ratio for signal C, node 406, is the parallelized value of the branch that contains NFET41 and NFET43, 5.9. The resultant maximum P/N ratios for signal B and signal C is 30.6/5.9 and 28.6/5.9 respectively.

Figure 7:
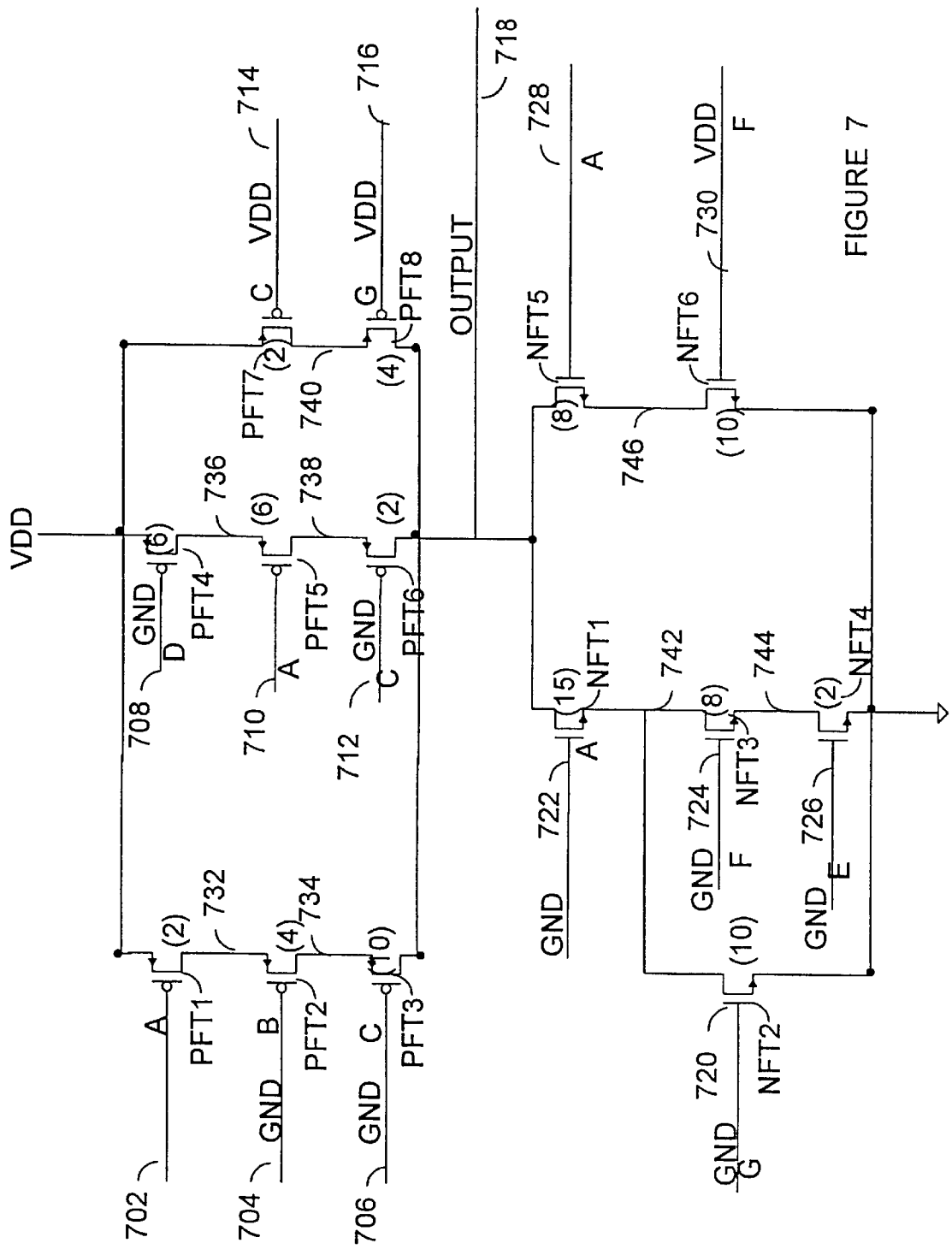
FIG. 7 is a schematic drawing of a complex static logic gate configured to simulate noise on node A and at the output.

Noise on the output of a static gate may be simulated by determining the maximum and minimum P/N ratios as previously described and applying a noise signal to the input of the static gate. FIG. 7 is a schematic drawing of a complex static gate configured to give the maximum P/N ratio for this gate. The source of PFET, PFT1 is connected to VDD. The drain of PFET PFT1 is connected to the source of PFET, PFT2 at node 732. The gate of PFET, PFT1 is connected to input A at node 702. The drain of PFET, PFT2 is connected to the source of PFET, PFT3 at node 734. The drain of PFET, PFT3 is connected to the output, OUTPUT. The gate of PFET, PFT2 and the gate of PFET, PFT3 are connected to GND. The source of PFET, PFT4 is connected to VDD. The drain of PFET PFT4 is connected to the source of PFET, PFT5 at node 736. The gate of PFET, PFT4 is GND at node 708. The drain of PFET, PFT5 is connected to the source of PFET, PFT6 at node 738. The drain of PFET, PFT6 is connected to the output, OUTPUT. The gate of PFET, PFT5 is connected to signal A at node 710. The gate of PFET, PFT6 is connected to GND at node 712. The source of PFET, PFT7 is connected to VDD. The drain of PFET, PFT7 is connected to the source of PFET, PFT8 at node 740. The gate of PFET, PFT7 is connected to VDD at node 714. The gate of PFET, PFT8 is connected to VDD at 716. The drain of PFET, PFT8 is connect to the output, OUTPUT.

The drain of NFET, NFT1 is connected to the output, OUTPUT at node 718. The source of NFET, NFT1 is connected to the drains of NFETS, NFT2 and NFT3 at node 742. The gate of NFET, NFT1 is connected to GND at node 722. The gate of NFET, NFT2 is connected to GND at node 720. The gate of NFET, NFT3 is connected to GND at node 724. The source of NFET, NFT2 is connected to GND. The source of NFET, NFT3 is connected to the drain of NFET, NFT4 at node 744. The gate of NFET, NFT4 is connected to GND at node 726. The source of NFET, NFT4 is connected to GND. The drain of NFET, NFT5 is connected to the output, OUTPUT at node 718. The source of NFET, NFT5 is connected to the drain of NFET, NFT6 at node 746. The gate of NFET, NFT5 is connected to signal A at node 728. The gate of NFET, NFT6 is connected to VDD at node 730. The source of NFET, NFT6 is connected to GND.

Figure 9:
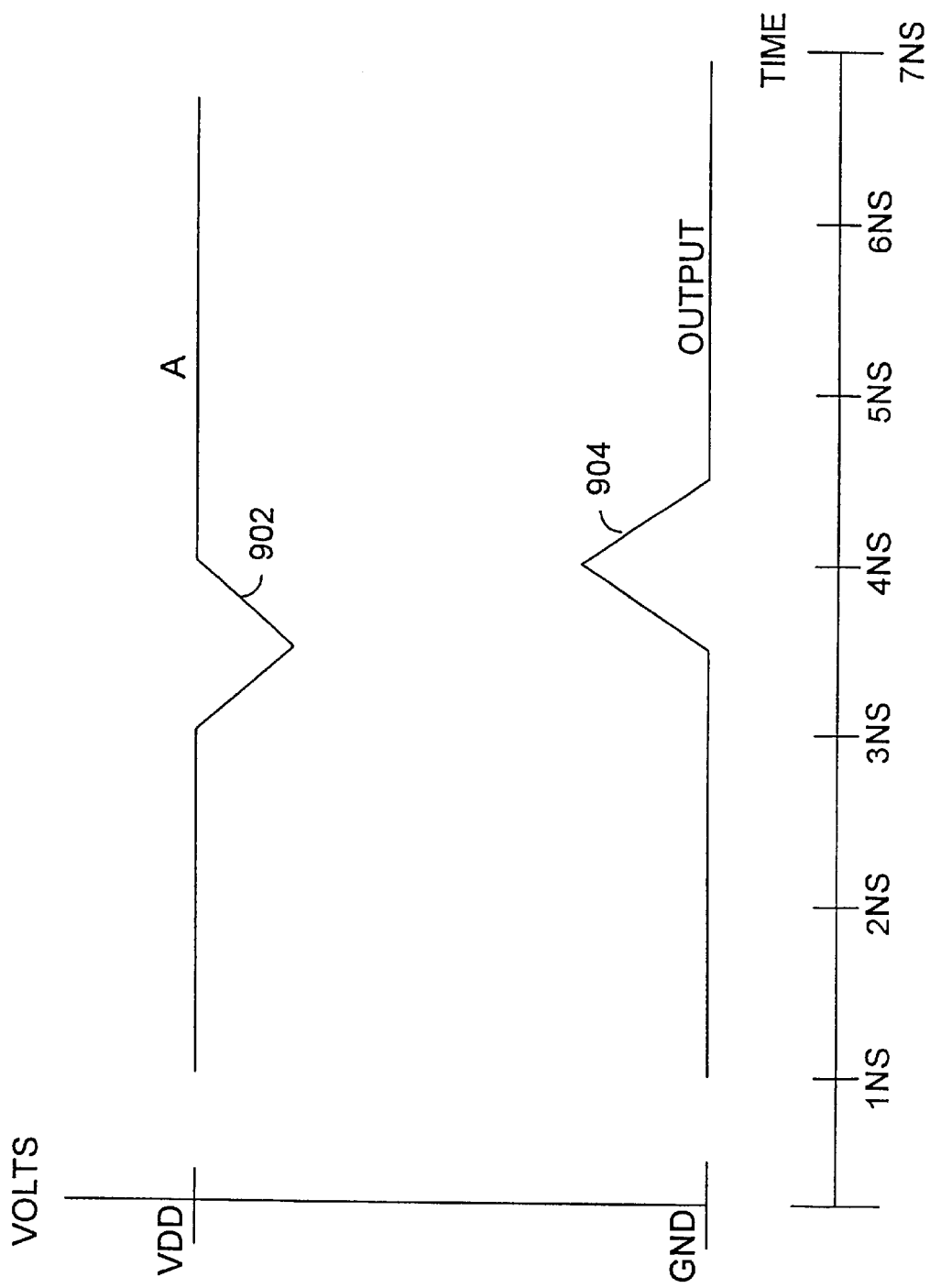
FIG. 9 is a drawing of a possible input waveform which could be used to drive node A of the complex static logic gate shown in FIG. 7 and a possible output waveform that may be created on the output of the complex static gate shown in FIG. 7.

A signal A, for example, as shown in FIG. 9 may be simulated on node A of the static logic gate shown in FIG. 7 with a resultant output signal, OUTPUT as shown in FIG. 9. The output signal, OUTPUT, may then be evaluated as to whether it creates problems for other parts of the circuit containing the static logic gate shown in FIG. 7 based on the amplitude and duration of the output, OUTPUT. An example of a problem created by the noise on the output is when the waveform, OUTPUT shown in FIG. 9, drives into a latch that is open. If the latch was holding a logic value of "zero", the waveform, OUTPUT, may flip the latch to a "one". If the "one" is retained in the latch, this results in a data error. The maximum P/N ratio determined for FIG. 7 causes the amplitude of the signal created on the output, OUTPUT, to be larger value than if a minimum P/N ratio was used. By using the maximum P/N ratio, the example problem shown where the latch data is corrupted is made worse than if a minimum P/N value was used. There are cases where a minimum P/N ratio may be more likely to cause a noise problem than a maximum P/N ratio.

Figure 8:
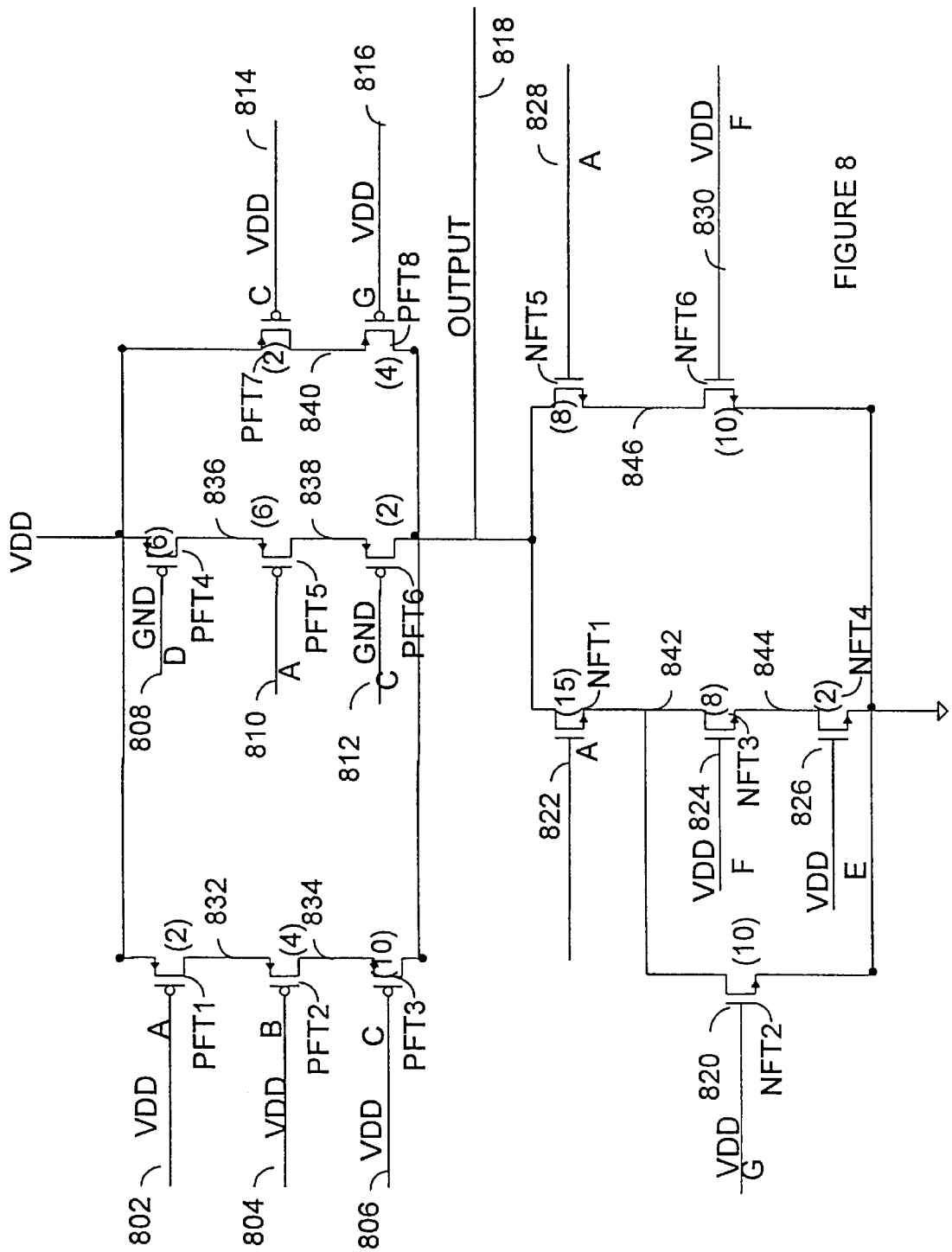
FIG. 8 is a schematic drawing of a complex static logic gate configured to simulate noise on node A and at the output.

FIG. 8 is a schematic drawing of logic gate that has been configured to create a minimum P/N ratio according to the method previously described. The source of PFET, PFT1 is connected to VDD. The drain of PFET PFT1 is connected to the source of PFET, PFT2 at node 832. The gate of PFET, PFT1 is connected to VDD at node 802. The drain of PFET, PFT2 is connected to the source of PFET, PFT3 at node 834. The drain of PFET, PFT3 is connected to the output, OUTPUT. The gate of PFET, PFT2 and the gate of PFET, PFT3 are connected to VDD. The source of PFET, PFT4 is connected to VDD. The drain of PFET PFT4 is connected to the source of PFET, PFT5 at node 836. The gate of PFET, PFT4 is GND at node 808. The drain of PFET, PFT5 is connected to the source of PFET, PFT6 at node 838. The drain of PFET, PFT6 is connected to the output, OUTPUT. The gate of PFET, PFT5 is connected to signal A at node 810. The gate of PFET, PFT6 is connected to GND at node 812. The source of PFET, PFT7 is connected to VDD. The drain of PFET, PFT7 is connected to the source of PFET, PFT8 at node 840. The gate of PFET, PFT7 is connected to VDD at node 814. The gate of PFET, PFT8 is connected to VDD at 816. The drain of PFET, PFT8 is connect to the output, OUTPUT.

The drain of NFET, NFT1 is connected to the output, OUTPUT at node 818. The source of NFET, NFT1 is connected to the drains of NFETS, NFT2 and NFT3 at node 842. The gate of NFET, NFT1 is connected to signal A at node 822. The gate of NFET, NFT2 is connected to VDD at node 820. The gate of NFET, NFT3 is connected to VDD at node 824. The source of NFET, NFT2 is connected to GND. The source of NFET, NFT3 is connected to the drain of NFET, NFT4 at node 844. The gate of NFET, NFT4 is connected to VDD at node 826. The source of NFET, NFT4 is connected to GND. The drain of NFET, NFT5 is connected to the output, OUTPUT at node 818. The source of NFET, NFT5 is connected to the drain of NFET, NFT6 at node 846. The gate of NFET, NFT5 is connected to signal A at node 828. The gate of NFET, NFT6 is connected to VDD at node 830. The source of NFET, NFT6 is connected to GND.

Figure 10:
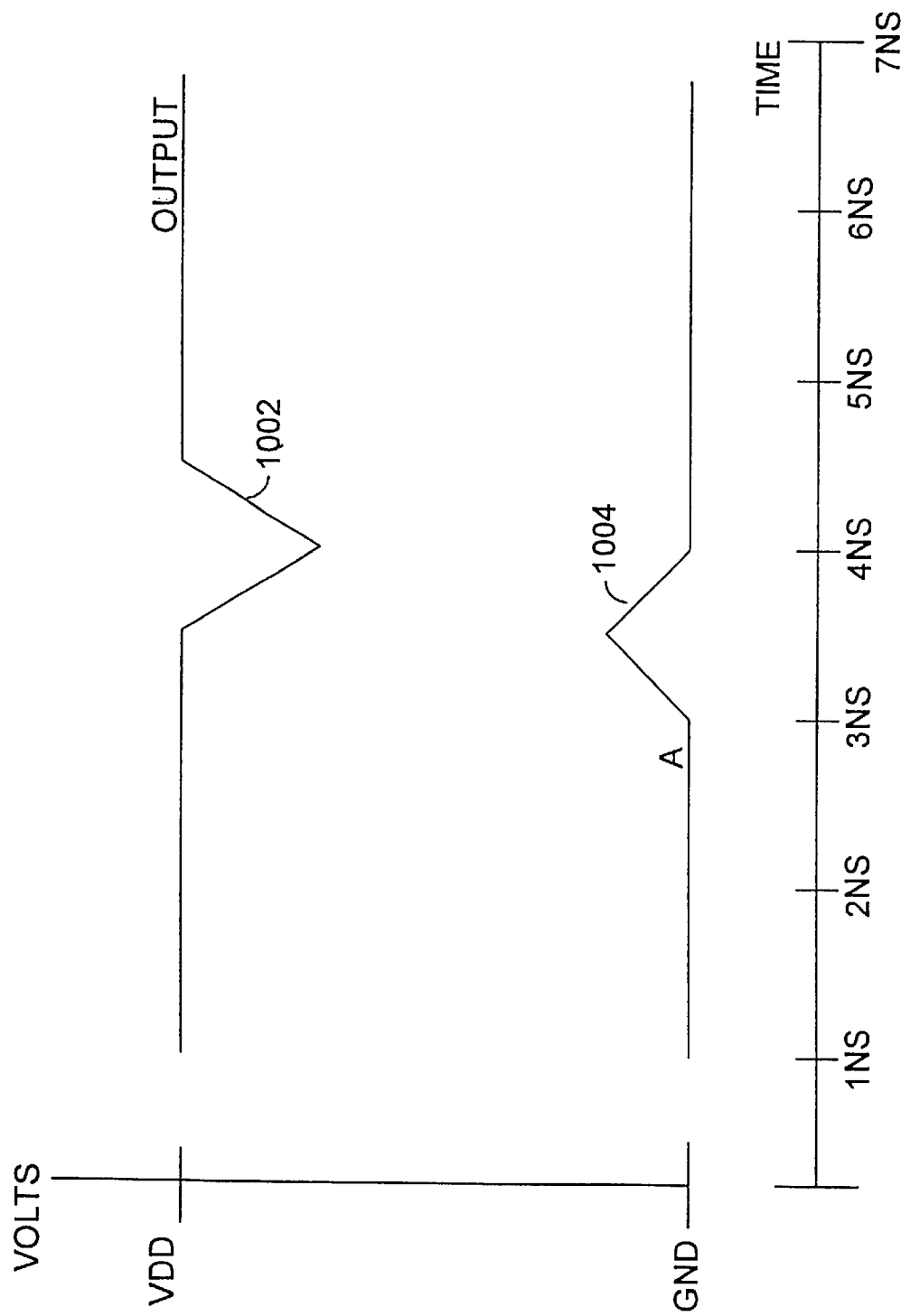
FIG. 10 is a drawing of a possible input waveform which could be used to drive node A of the complex static logic gate shown in FIG. 8 and a possible output waveform that may be created on the output of the complex static gate shown in FIG. 8.

A signal A, for example, as shown in FIG. 10 may be simulated on node A of the static logic gate shown in FIG. 8 with a resultant output signal, OUTPUT as shown in FIG. 10. The output signal, OUTPUT, may then be evaluated as to whether it creates problems for other parts of the circuit containing the static logic gate shown in FIG. 8 based on the amplitude and duration of the output, OUTPUT.

An example of a problem created by noise on the output is when the waveform, OUTPUT shown in FIG. 10, drives into a latch that is open. If the latch was holding a logic value of "one", the waveform, OUTPUT, may flip the latch to a "zero". If the "zero" is retained in the latch, this results in a data error. The minimum P/N ratio determined for FIG. 8 causes the absolute value of the amplitude of the signal created on the output, OUTPUT, to be a larger value than if a maximum P/N ratio was used. By using the minimum P/N ratio, the example problem shown where the latch data is corrupted is made worse than if a maximum P/N value was used.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for simulating noise on an input of a static logic gate and determining noise on an output of the gate comprising:
   a) identifying directly-connected FETs of a first type connected to an output node;
   b) identifying directly-connected FETs of a second type connected to said output node;
   c) identifying branches of a first type created by said first type FETs connected to said output node;
   d) identifying branches of a second type created by said second type FETs connected to said output node;
   e) selecting an allowable input voltage;
   f) storing width values of all said first type FETs activated by said chosen input values;
   g) storing width values of all said second type FETs activated by said chosen input values;
   h) determining an effective width of said stored width values in step (f);
   i) determining an effective width of said stored width values in step (g);
   j) dividing the effective width in step (h) by the effective width in step (i);
   k) repeating steps (e) through (j) until all possible input voltage combinations have been exhausted;
   l) choosing a P/N ratio from the combinations;
   m) simulating noise on an input of said P/N ratio;
   n) determining noise created on an output of said P/N ratio.

2. The method as in claim 1 wherein the FETs of a first type are PFETs.

3. The method as in claim 1 wherein the FETs of a second type are NFETs.

4. The method as in claim 1 wherein the FETs of a first type are PFETs and the FETs of a second type are NFETs.

5. The method as in claim 4 wherein a maximum P/N value is calculated.

6. The method as in claim 4 wherein a minimum P/N value is calculated.

7. A computer-readable medium having computer-executable instructions for performing a method for simulating noise on an input of a static gate and determining noise on an output of the gate comprising:
   a) identifying directly-connected FETs of a first type connected to an output node;
   b) identifying directly-connected FETs of a second type connected to said output node;
   c) identifying branches of a first type created by said first type FETs connected to said output node;
   d) identifying branches of a second type created by said second type FETs connected to said output node;
   e) selecting an allowable input voltage;
   f) storing width values of all said first type FETs activated by said chosen input values;
   g) storing width values of all said second type FETs activated by said chosen input values;
   h) determining an effective width of said stored width values in step (f);
   i) determining an effective width of said stored width values in step (g);
   j) dividing the effective width in step (h) by the effective width in step (i);
   k) repeating steps (e) through (j) until all possible input voltage combinations have been exhausted;
   l) choosing a P/N ratio from the combinations;
   m) simulating noise on an input of said P/N ratio;
   n) determining noise created on an output of said P/N ratio.

8. The medium as in claim 7 wherein the FETs of a first type are PFETs.

9. The medium as in claim 7 wherein the FETs of a second type are NFETs.

10. The medium as in claim 7 wherein the FETs of a first type are PFETs and the FETs of a second type are NFETs.

11. The medium as in claim 10 wherein a maximum P/N value is calculated.

12. The medium as in claim 10 wherein a minimum P/N value is calculated.

13. A computer system for calculating P/N ratios in static logic gates in a circuit design comprising:
   a) a storage medium;
   b) a software program stored on the storage medium for calculating P/N ratios in static logic gates in circuit designs, said software comprising a set of instructions for:
      1) identifying directly-connected FETs of a first type connected to an output node;
      2) identifying directly-connected FETs of a second type connected to said output node;
      3) identifying branches of a first type created by said first type FETs connected to said output node;
      4) identifying branches of a second type created by said second type FETs connected to said output node;
      5) selecting an allowable input voltage;
      6) storing width values of all said first type FETs activated by said chosen input values;
      7) storing width values of all said second type FETs activated by said chosen input values;
      8) determining an effective width of said stored width values in step (6);
      9) determining an effective width of said stored width values in step (7);
      10) dividing the effective width in step (8) by the effective width in step (9);

11) repeating steps (5) through (10) until all possible input voltage combinations have been exhausted;
12) choosing a P/N ratio from the combinations;
13) simulating noise on an input of said P/N ratio;
14) determining noise created on an output of said P/N ratio.

14. The computer system as in claim 13 wherein the FETs of a first type are PFETs.

15. The computer system as in claim 13 wherein the FETs of a second type are NFETs.

16. The computer system as in claim 13 wherein the FETs of a first type are PFETs and the FETs of a second type are NFETs.

17. The computer system as in claim 16 wherein a maximum P/N value is calculated.

18. The computer system as in claim 16 wherein a minimum P/N value is calculated.

* * * * *

UNITED STATES PATENT AND TRADEMARK OFFICE
CERTIFICATE OF CORRECTION

PATENT NO.    : 6,502,223 B1                              Page 1 of 1
DATED         : December 31, 2002
INVENTOR(S)   : S. Brandon Keller et al.

It is certified that error appears in the above-identified patent and that said Letters Patent is hereby corrected as shown below:

<u>Column 11,</u>
Line 50, delete "PIN" and therefor -- P/N --

Signed and Sealed this

Twenty-second Day of June, 2004

JON W. DUDAS
*Acting Director of the United States Patent and Trademark Office*